United States Patent
Dosluoglu

(10) Patent No.: US 6,897,519 B1
(45) Date of Patent: May 24, 2005

(54) TUNNELING FLOATING GATE APS PIXEL

(75) Inventor: Taner Dosluoglu, New York, NY (US)

(73) Assignee: Dialog Semiconductor, Clinton, NJ (US)

( * ) Notice: Subject to any disclaimer, the term of this patent is extended or adjusted under 35 U.S.C. 154(b) by 0 days.

(21) Appl. No.: 10/627,796

(22) Filed: Jul. 25, 2003

Related U.S. Application Data

(60) Provisional application No. 60/450,091, filed on Feb. 26, 2003.

(51) Int. Cl.[7] .................. H01L 29/788; H01L 31/06
(52) U.S. Cl. ............................. 257/315; 257/461
(58) Field of Search ......................... 257/315, 461, 257/292, 291

(56) References Cited

U.S. PATENT DOCUMENTS

| | | | |
|---|---|---|---|
| 5,541,402 A | 7/1996 | Ackland et al. | 250/208.1 |
| 5,608,243 A | 3/1997 | Chi et al. | 257/249 |
| 5,936,866 A | 8/1999 | Seitz et al. | 364/490 |
| 6,008,486 A | 12/1999 | Stam et al. | 250/208.1 |
| 6,166,768 A | 12/2000 | Fossum et al. | 348/308 |
| 6,350,979 B1 | 2/2002 | Jing | 250/208.1 |
| 6,501,109 B1 | 12/2002 | Chi | 257/223 |

*Primary Examiner*—Steven Loke
(74) *Attorney, Agent, or Firm*—George O. Saile; Stephen B. Ackerman; Larry J. Prescott

(57) ABSTRACT

A floating gate pixel is described which is formed by forming an N well in a P type silicon substrate. A P well is formed in the N well A gate is formed over a thin gate oxide, about 25 Angstroms thickness, such that the gate is directly over part of the P well and part of the N well. A P+ contact in the P well allows connection to a reset voltage source, usually through a reset transistor, to reset the pixel. The pixel is reset by setting the potential between the P well and the substrate, which is usually held at ground potential. When the pixel is reset tunneling current through the thin gate oxide sets the voltage of the floating gate. During the charge integration cycle an input signal to the pixel, such as a light signal, changes the potential of the pixel. After the charge integration cycle the tunneling current through the gate oxide changes the potential of the floating gate by an amount related to the input signal to the pixel. The potential of the floating gate can then be read out to determine the input signal to the pixel. The pixel can also be embodied using a P well formed in an N type substrate, an N well formed in the P well, and an N+ contact formed in the N well.

26 Claims, 2 Drawing Sheets

TUNNELING FLOATING GATE APS PIXEL

This Patent Application claims priority to the following U.S. Provisional Patent Application, herein incorporated by reference:
Provisional Application No. 60/450,091 filed Jan. 26, 2003.

BACKGROUND OF THE INVENTION (1) Field of the Invention

This invention relates to a tunneling floating gate APS pixel and more particularly to advantageously using tunneling current in a thin oxide in pixel operation.

(2) Description of The Related Art

In a CMOS APS pixel structure having very thin gate oxides tunneling currents will occur through the gate oxide. These tunneling currents must be taken into account in the operation of these pixels.

U.S. Pat. No. 6,008,486. to Stam et al. describes a method for increasing effective integration time of an optical sensor. In some of the embodiments a floating diffusion is used in the operation of the pixel, however in one embodiment the floating diffusion is replaced by a floating gate.

U.S. Pat. No. 6,501,109 B1 to Chi describes an active pixel sensor cell formed in a semiconductor substrate utilizing a polysilicon floating gate.

U.S. Pat. No. 5,936,866 to Seitz describes a photoelectric semiconductor light-detection device with programmable dynamic performance. In at least one embodiment a floating gate, to which analog quantities of charge can be applied by tunneling currents, is used.

U.S. Pat. No. 6,350,979 B1 to Jing describes a CMOS image sensor having a floating gate with a comb structure.

U.S. Pat. No. 6,166,768 to Fossum et al. describes an active pixel sensor array, formed using CMOS integrated circuits, using floating gate pixels.

U.S. Pat. No. 5,608,243 to Chi et al. describes a split-gate MOS transistor active pixel sensor cell which utilizes a split gate.

U.S. Pat. No. 5,541,402 to Ackland et al. describes an imaging pixel which has a floating gate pixel node capable of nondestructive readout and source follower output circuitry.

SUMMARY OF THE INVENTION

Designing an APS pixel in 0.13 micron processing presents problems due to high dark current and gate tunneling current. As dimensions shrink in CMOS process technology the gate oxides also become thinner. These thinner oxides, about 25 Angstroms, result in tunneling currents through the gate oxide. In many cases, such tunneling currents have been considered a problem in CMOS pixel design. This invention provides a pixel design that is not adversely affected by the tunneling current, uses the floating gate tunneling current to set the bias voltage of the floating gate, and uses the tunneling current of the floating gate to produce a voltage signal on the floating gate which is related to the light incident on the pixel. Other than a connection to a means for determining the floating gate potential, the floating gate is left unconnected.

It is a principle objective of this invention to provide a method of operating a floating gate APS, active pixel sensor, pixel.

It is another principle objective of this invention to provide a floating gate APS, active pixel sensor, pixel.

These objectives are achieved by forming an N well in a P type silicon substrate. A P well is formed in the N well A gate is formed over a thin gate oxide, about 25 Angstroms thickness, such that the gate is directly over part of the P well and part of the N well. A $P^+$ contact in the P well allows connection to a reset voltage source, usually through a reset transistor, to reset the pixel. The pixel is reset by setting the potential between the P well and the substrate, which is usually held at ground potential. When the pixel is reset tunneling current through the thin gate oxide sets the voltage of the floating gate. During the charge integration cycle an input signal to the pixel, such as a light signal, changes the potential of the pixel. After the charge integration cycle the tunneling current through the gate oxide changes the potential of the floating gate by an amount related to the input signal to the pixel. The potential of the floating gate can then be read out to determine the input signal to the pixel.

The pixel of this invention can also be formed by replacing the P type substrate with an N type substrate, the N well with a P well, the N will with an N well, and the $P^+$ contact region with an $N^+$ contact region.

DESCRIPTION OF THE PREFERRED EMBODIMENTS

Figure 1:
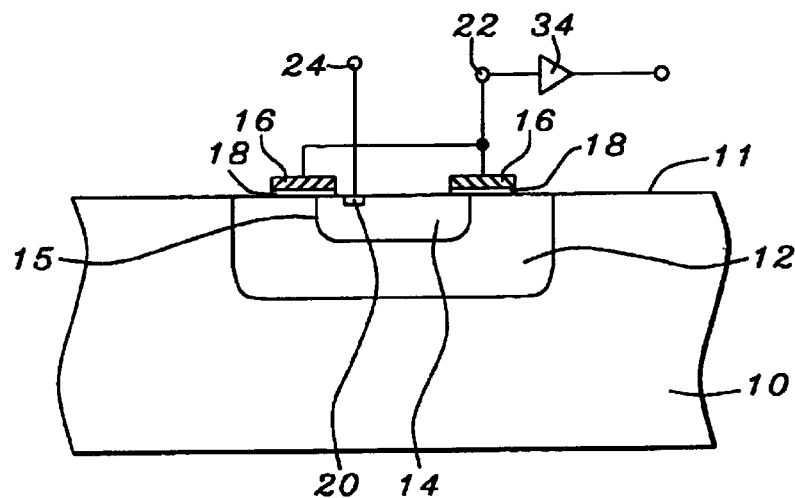
FIG. 1 shows a cross section view of a floating gate pixel of this invention

FIG. 1 shows a cross section view of an example of a floating gate pixel. An N well 12 is formed in a P type silicon substrate, usually a P type epitaxial silicon substrate. A P well 14 is formed in the N well 12. The only contact to the pixel structure is in the P well 14 and is shown as a single $P^+$ type contact 20 in FIG. 1. This $P^+$ type contact 20 allows the pixel to be reset and serves as a source/drain region. A gate oxide 18 is formed on the substrate and a gate electrode 16 is formed on the gate oxide 18. Although two sections of the gate electrode 16 are shown in FIG. 1 the two sections are part of a single gate electrode. The gate electrode has a closed shape such as a donut shape and is connected to an output terminal 22. The gate oxide 18 and the gate electrode 16 are directly over part of the P well 14, part of the N well 12, and the intersection of the PN junction 15 between the P well 14 and the N well 12 and the top surface 11 of the pixel. Alternatively the gate oxide 18 can cover the entire top surface 11 of the pixel, although this option is not shown in FIG. 1. An output amplifier 34, connected to the output terminal 22, is used to read the potential of the floating gate 16.

Figure 2:
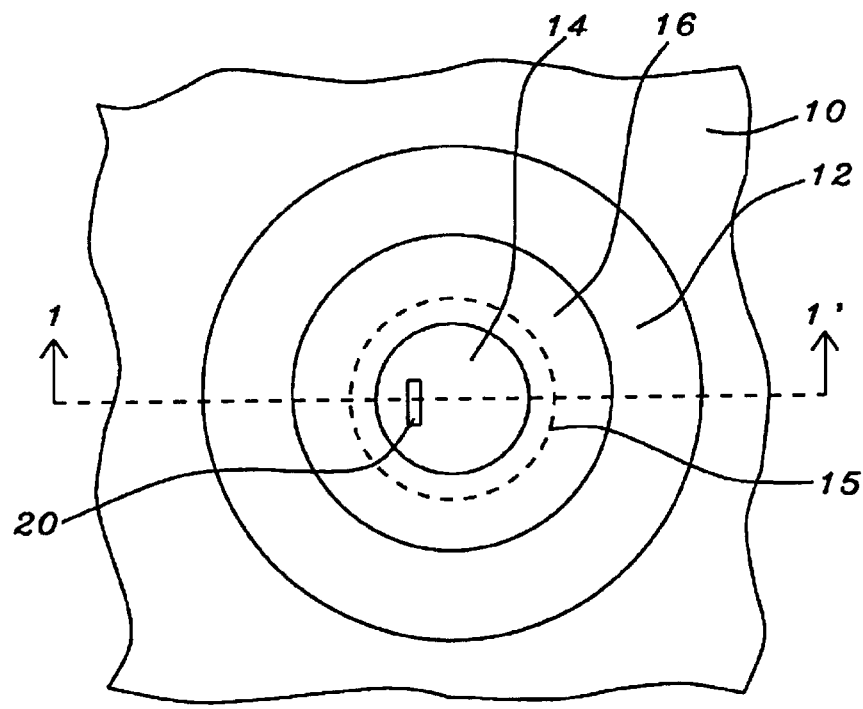
FIG. 2 shows a top view of a floating gate pixel of this invention.

The top view of the pixel is shown in FIG. 2. FIG. 2 shows a donut shaped gate electrode 16. The perimeter of the P well 14 is shown by a dashed line in FIG. 2, which is also the intersection of the PN junction 15 between the P well 14 and the N well 12 and the top surface 11 of the pixel. FIG. I is a cross section view of the pixel taken along line 1–1' of FIG. 2. The gate electrode is typically formed of polysilicon, however other conducting materials can be used. The gate oxide is a sufficiently thin oxide to allow tunneling current to flow through the gate oxide 18. The gate oxide thickness is less than or equal to 30 Angstroms, and typically has a thickness of about 25 Angstroms. As is shown in FIGS. 1 and 2, the gate electrode is directly over part of the N well 12 and part of the P well 14.

Figure 3:
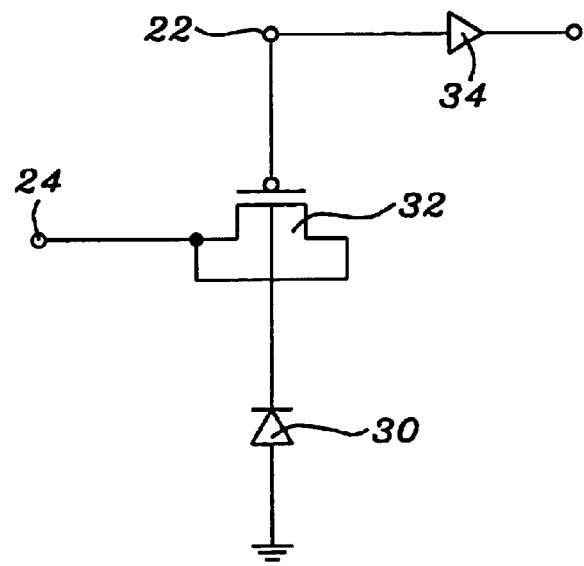
FIG. 3 shows a schematic diagram of a circuit which can be used to reset and read the pixel.

FIG. 3 shows a schematic diagram of the tunnel floating gate pixel of this invention. The diode 30 represents the PN junction between the N well 12 and the P type substrate 10 shown in FIG. 1. The PMOS transistor 32 represents the floating gate structure showing the reset terminal 24. The P+ type contact 20, shown in FIG. 1, serves as the source/drain region, which are shown electrically connected together in the PMOS transistor 32 of FIG. 3. An output amplifier 34 connected to the output terminal 22 is used to read the potential of the floating gate.

Refer to FIGS. 1 and 3 for the following description of the tunnel floating gate pixel. To reset the pixel the reset terminal 24 is set at a positive potential with respect to the P type substrate, such as $V_{DD}$, thereby reverse biasing the diode 30 representing the PN junction between the N well 12 and the P type substrate 10. This potential at the reset terminal 24 also causes tunneling current to flow through the gate oxide 18 between the P well 14 and the floating gate electrode 16 and sets an initial potential on the floating gate electrode 16. The reset terminal is then disconnected and floats during the charge integration period. During the charge integration period an external signal on the pixel, such as light energy, alters the charge stored at the PN junction between the N well 12 and the P type substrate 10 and thereby alters the potentials of the N well 12 and the P well 14. The change in potential of the P well 14 causes tunneling current through the gate oxide 18 between the P well 14 and the floating gate electrode 16 again changing the potential of the floating gate 16. At the end of the charge integration period the amplifier 34 connected to the output terminal 22 can be used to read the change in potential of the floating gate 16. In this description potentials are referenced to the potential of the P type substrate 10, which typically is held at ground potential.

Figure 4:
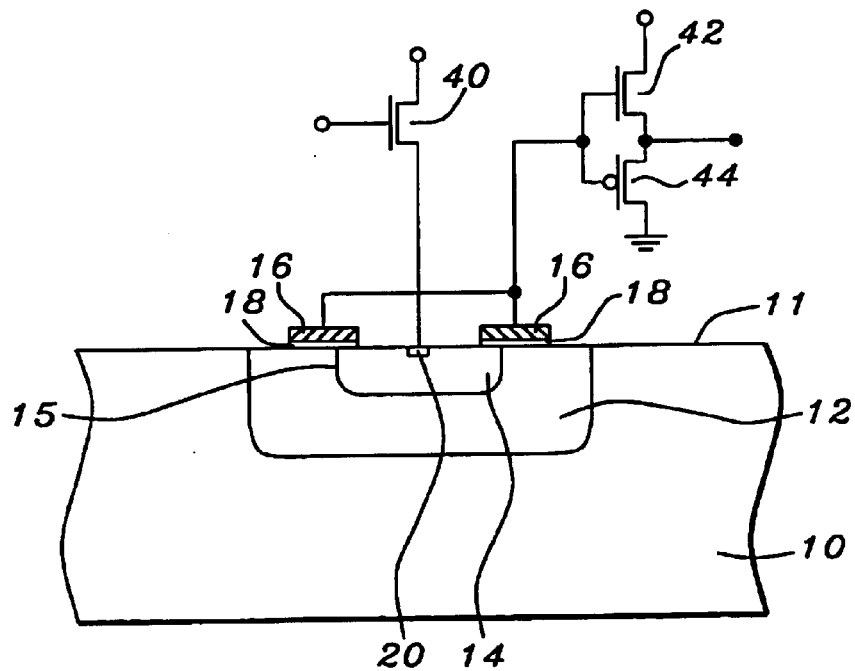
FIG. 4 shows a cross section view of a floating gate pixel of this invention showing a reset transistor for resetting the pixel and a source follower circuit for reading the pixel.

FIG. 4 shows the floating gate pixel of this invention showing an NMOS transistor 40 as a reset transistor for resetting the pixel. FIG. 4 also shows a source follower transistor circuit for reading the potential of the gate electrode 16. The source follower circuit comprises a first transistor 42, an NMOS transistor, and a second transistor 44, a PMOS transistor. Other means can also be used for resetting the pixel and reading the potential of the gate electrode 16.

In the 0.13 micron process technology the gate oxides are very thin and tunneling currents through the gate oxide can be a significant problem. The pixel of this invention takes advantage of the tunneling current in the operation and readout of the pixel. In the pixel of this invention a pixel reset transistor is completely eliminated This elimination of the reset transistor saves valuable space in the pixel as well as avoiding problems due to tunneling currents in a reset transistor.

The floating gate pixel of this invention has been described with reference to an N well 12 formed in a P type substrate 10, a P well 14 formed in the N well 12, and a P+ contact 20 formed in the P well 14. Those skilled in the art will readily recognize that the invention can also be embodied using a P well 12 formed in an N type substrate 10, an N well 14 formed in the P well 12, and an N+ contact 20 formed in the N well 14, see FIGS. 1 and 4. In this alternative embodiment the reset transistor 40 will be a PMOS transistor, the first transistor 42 in the source follower circuit will be a PMOS transistor, and the second transistor 44 in the source follower circuit will be an NMOS transistor.

While the invention has been particularly shown and described with reference to the preferred embodiments thereof, it will be understood by those skilled in the art that various changes in form and details may be made without departing from the spirit and scope of the invention.

What is claimed is:

1. A method of operating a floating gate pixel, comprising:
   providing a P type silicon substrate;
   forming an N well in said substrate, wherein said N well is N type silicon and has no contact regions formed therein;
   forming a P well in said N well, wherein said P well is P type silicon;
   forming a contact region in said P well, wherein said contact region is P+ type silicon and is the only contact region formed in said P well;
   forming a gate oxide on said substrate, wherein said gate oxide has a thickness which is sufficiently small to allow tunneling through said gate oxide;
   forming a floating gate on said gate oxide, wherein said floating gate is directly over part of said P well and part of said N well and the only electrical connection to said floating gate is to connect said floating gate to a means for determining the potential of said floating gate;
   resetting the potential between said P well and said substrate during a reset period wherein a tunneling current between said P well and said floating gate resets the potential of said floating gate;
   accumulating charge at the PN junction between said P type silicon substrate and said N well during a charge integration period, thereby changing the potential of said N well, said P well, and said floating gate and wherein said charge integration period follows said reset period; and
   reading the potential of said floating gate after said charge integration period has been completed.

2. The method of claim 1 wherein the charge accumulated at the PN junction between said P type silicon substrate and said N well is related to the amount of light incident on the P type silicon substrate and the N well during said charge integration period.

3. The method of claim 1, further comprising:
   forming an electrical connection between said contact region formed in said P well and a means for resetting the potential between said P well and said substrate; and
   forming an electrical connection between said floating gate and said means for determining the potential of said floating gate.

4. The method of claim 1 wherein the PN junction between said P type silicon substrate and said N well forms a photodiode.

5. The method of claim 1 wherein the thickness of said gate oxide is less than or equal to 30 Angstroms.

6. The method of claim 1 wherein said resetting the potential between said P well and said substrate is accomplished using a reset transistor.

7. The method of claim 1 wherein said means for determining the potential of said floating gate comprises a source follower transistor circuit.

8. A method of operating a floating gate pixel, comprising:
   providing an N type silicon substrate;
   forming a P well in said substrate, wherein said P well is P type silicon and has no contact regions formed therein;
   forming an N well in said P well, wherein said N well is N type silicon;
   forming a contact region in said N well, wherein said contact region is N+ type silicon and is the only contact region formed in said N well;
   forming a gate oxide on said substrate, wherein said gate oxide has a thickness which is sufficiently small to allow tunneling through said gate oxide;
   forming a floating gate on said gate oxide, wherein said floating gate is directly over part of said N well and part of said P well and the only electrical connection to said floating gate is to connect said floating gate to a means for determining the potential of said floating gate;

resetting the potential between said N well and said substrate during a reset period wherein a tunneling current between said N well and said floating gate resets the potential of said floating gate;

accumulating charge at the PN junction between said N type silicon substrate and said P well during a charge integration period, thereby changing the potential of said P well, said N well, and said floating gate and wherein said charge integration period follows said reset period; and reading the potential of said floating gate after said charge integration period has been completed.

9. The method of claim 8 wherein the charge accumulated at the PN junction between said N type silicon substrate and said P well is related to the amount of light incident on the N type silicon substrate and the P well during said charge integration period.

10. The method of claim 8, further comprising:

forming an electrical connection between said contact region formed in said N well and a means for resetting the potential between said N well and said substrate; and forming an electrical connection between said floating gate and said means for determining the potential of said floating gate.

11. The method of claim 8 wherein the PN junction between said P well and said N type silicon substrate forms a photodiode.

12. The method of claim 8 wherein the thickness of said gate oxide is less than or equal to 30 Angstroms.

13. The method of claim 8 wherein said resetting the potential between said N well and said substrate is accomplished using a reset transistor.

14. The method of claim 8 wherein said reading the potential of said floating gate comprises a source follower transistor circuit.

15. A floating gate pixel, comprising:

a P type silicon substrate;

an N well formed in said substrate, wherein said N well is N type silicon and has no contact regions formed therein;

a P well formed in said N well, wherein said P well is P type silicon;

a contact region formed in said P well, wherein said contact region is P$^+$ type silicon and is the only contact region formed in said P well;

a gate oxide formed on said substrate, wherein said gate oxide has a thickness which is sufficiently small to allow tunneling through said gate oxide;

a floating gate formed on said gate oxide, wherein said floating gate is directly over part of said P well and part of said N well;

means for resetting the potential between said P well and said substrate; and means for reading the potential of said floating gate, wherein the only electrical connection to said floating gate is to connect said floating gate to said means for reading the potential of said floating gate.

16. The floating gate pixel of claim 15 further comprising:

electrical connection between said contact region formed in said P well and said means for resetting the potential between said P well and said substrate; and electrical connection between said floating gate and said means for reading the potential of said floating gate.

17. The floating gate pixel of claim 15 wherein the PN junction between said P type silicon substrate and said N well forms a photodiode.

18. The floating gate pixel of claim 15 wherein the thickness of said gate oxide is less than or equal to 30 Angstroms.

19. The floating gate pixel of claim 15 wherein said means for resetting the potential between said P well and said substrate comprises a reset transistor.

20. The floating gate pixel of claim 15 wherein said means for reading the potential of said floating gate comprises a source follower transistor circuit.

21. A floating gate pixel, comprising:

an N type silicon substrate;

a P well formed in said substrate, wherein said P well is P type silicon and has no contact regions formed therein;

an N well formed in said P well, wherein said N well is N type silicon;

a contact region formed in said N well, wherein said contact region is N$^+$ type silicon and is the only contact region formed in said N well;

a gate oxide formed on said substrate, said gate oxide has a thickness which is sufficiently small to allow tunneling through said gate oxide;

a floating gate formed on said gate oxide, wherein said floating gate is directly over part of said N well and part of said P well;

means for resetting the potential between said N well and said substrate; and means for determining the potential of said floating gate, wherein the only electrical connection to said floating gate is to connect said floating gate to said means for determining the potential of said floating gate.

22. The floating gate pixel of claim 21 further comprising:

an electrical connection between said contact region formed in said N well and said means for resetting the potential between said N well and said substrate; and an electrical connection between said floating gate and said means for determining the potential of said floating gate.

23. The floating gate pixel of claim 21 wherein the PN junction between said N type silicon substrate and said P well forms a photodiode.

24. The floating gate pixel of claim 21 wherein the thickness of said gate oxide is less than or equal 30 Angstroms.

25. The floating gate pixel of claim 21 wherein said means for resetting the potential between said N well and said substrate comprises a reset transistor.

26. The floating gate pixel of claim 21 wherein said means for determining the potential of said floating gate comprises a source follower transition circuit.

* * * * *